United States Patent [19]
Abe et al.

[11] Patent Number: 5,495,190
[45] Date of Patent: Feb. 27, 1996

[54] ARBITER CIRCUIT

[75] Inventors: Keiichiroh Abe; Souichirou Kamei, both of Tsukuba, Japan

[73] Assignee: Texas Instruments Incorporated, Dallas, Tex.

[21] Appl. No.: 266,000

[22] Filed: Jun. 27, 1994

[30] Foreign Application Priority Data

Jun. 28, 1993 [JP] Japan .................................... 5-181939

[51] Int. Cl.⁶ ...................................................... G11C 8/00
[52] U.S. Cl. ................................ 327/19; 327/18; 327/23; 365/230.05
[58] Field of Search ......................... 365/230.05; 327/18, 327/19, 23

[56] References Cited

FOREIGN PATENT DOCUMENTS

| 0202396 | 9/1986 | Japan | 365/230.05 |
| 0296486 | 11/1989 | Japan | 365/230.05 |
| 4271089 | 9/1992 | Japan | 365/230.05 |
| 4298882 | 10/1992 | Japan | 365/230.05 |

*Primary Examiner*—Margaret Rose Wambach
*Attorney, Agent, or Firm*—David S. Guttman; Richard L. Donaldson

[57] ABSTRACT

An arbiter circuit for determining priority as between two or more competing request signals and applicable for use in a memory system having a number of memories operating independently without interfering with one another. For each of a number of memories, a receiving circuit 10(*i*) and an arbitration circuit 12(*i*) with standardized configurations are allotted. Common memory cycle clock pulse ARB-CLK is sent from memory cycle generator 16 to all of arbiter units 14(1)–14(N). From the arbiter units 14(1)–14(N), the commands for the respective memories are output in synchronization to each other based on memory cycle clock pulse ARB-CLK.

7 Claims, 5 Drawing Sheets

ARBITER CIRCUIT

This invention concerns a semiconductor circuit, more specifically, an arbiter circuit which can handle a number of memories.

BACKGROUND OF THE INVENTION

Figure 7:
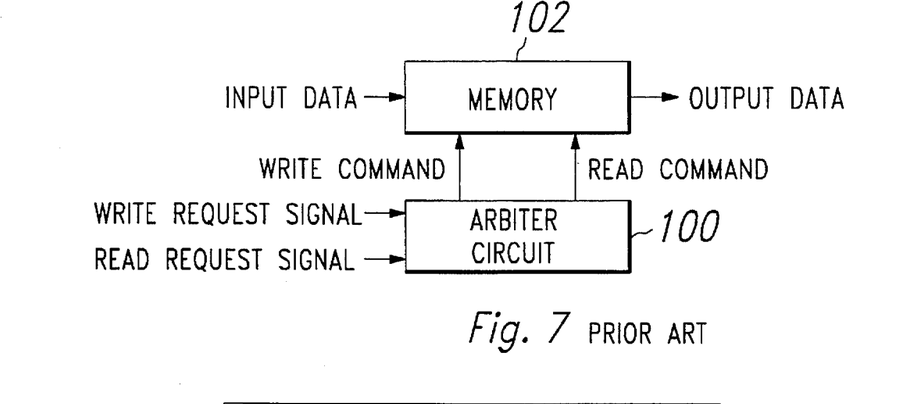
FIG. 7 is a block diagram of a memory system when a conventional arbiter circuit is used.

An arbiter circuit is a type of circuit which can determine which request to be replied to when two or more request signals compete with each other. As shown in FIG. 7, a conventional arbiter circuit 100 in a memory system can receive the write request signal and read request signal with respect to memory 102 in an asynchronous manner, and the arbiter circuit then determines the priority order for the two request signals. For example, the arbiter circuit may let the write command go first, followed by the read command.

Figure 8:
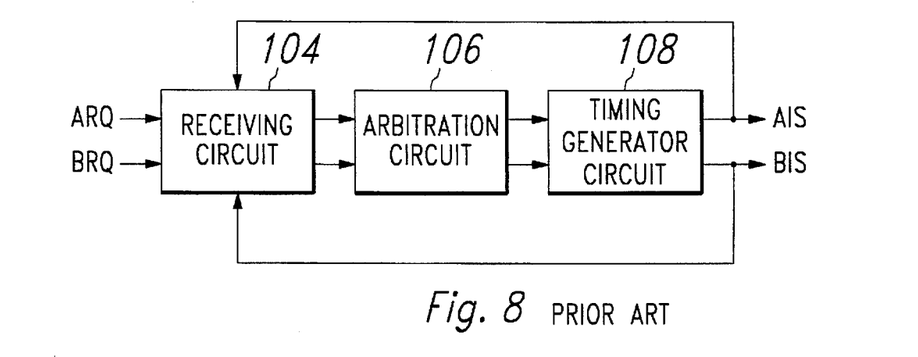
FIG. 8 is a block diagram of a conventional arbiter circuit.

FIG. 8 illustrates a configuration of a conventional arbiter circuit. Basically, the conventional arbiter circuit comprises the following parts: receiving circuit 104 which receives and holds a number, for example, two, request signals ARQ and BRQ; arbitration circuit 106 which conducts arbitration between the two request signals ARQ and BRQ when they compete with each other; and timing generating circuit 108 which generates at the prescribed timing command XIS (X=A or B) for executing the memory cycle corresponding to the request in the memory (not shown in the figure) corresponding to the request signal XRQ (X=A or B) selected by the arbitration circuit 106. These circuits are connected in series.

When a certain command XIS travels from timing generating circuit 108, it is fed back to receiving circuit 104, and a hold on request signal XRQ corresponding to said command XIS is released. Consequently, when request signal ARQ has priority out of the two competing request signals ARQ and BRQ, command AIS is output from timing generating circuit 108, and, either at the same time or a little later, request signal ARQ is released at receiving circuit 104; in the next cycle, the other request signal BRQ, which has been held in receiving circuit 104 up to that time, is selected by arbitration circuit 106, and command BIS is output from timing generating circuit 108.

However, with an increase in the integration density of the semiconductor memory in recent years, there are cases in which a number of memories are carried on a single chip. In this case, although on a single chip, the number of memories receive memory access independent from one another. Consequently, as shown in FIG. 8, for each memory, a conventional arbiter circuit is arranged. As a result, the memories operate independently (that is, asynchronously), and harmful noises are sent to each other.

For example, in a dynamic RAM, the small change (such as 100 mV) in the potential of the bit line, which has been precharged to a prescribed voltage, corresponding to the memory information of the memory cell is amplified by a sense amplifier and detected. When the other dynamic RAM works in an asynchronous manner during this delicate sensing operation, the noise generated there may affect the sensing voltage, and the read data may be ruined.

Figure 9:
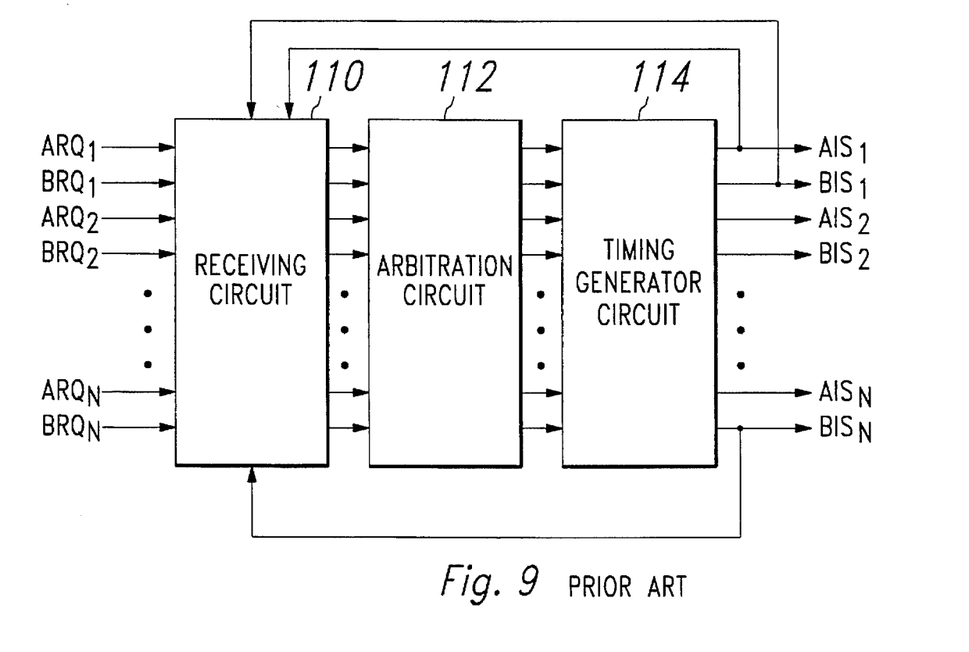
FIG. 9 is a block diagram of the conventional arbiter circuit with a number of memory systems formed on a single chip.

As shown in FIG. 9, in the conventional method, when each of a number (N) of memories receives a number of (for example, two) request signals $(ARQ_1, BRQ_1)$, $(ARQ_2, BRQ_2)$, ..., $(ARQ_N, BRQ_N)$ through the common receiving circuit 110, with competition taking place among these request signals $ARQ_1$, $BRQ_1$, $ARQ_2$, $BRQ_2$, ..., $ARQ_N$, $BRQ_N$, arbitration is made by a common arbitration circuit 112. One of request signals $XRQ_i$ (X=A or B, i is any one of 1–N) is selected, and common timing generating circuit 114 generates, with a prescribed timing, command $XIS_i$ (X=A or B, i is any one of 1–N), which defines the memory cycle corresponding to request signal $XRQ_i$ selected with the priority, to the corresponding memory.

In this system, in which the arbitration processing is performed in a common arbiter circuit for the number of requests with respect to the number of memories, only one memory cycle can be generated at a time. Consequently, only one memory can operate at a time. As a result, the aforementioned problem related to mutual interference among the memories can be solved. However, when a number of request signals compete with each other for a number of memories, the request with the lowest priority has to wait until all of the requests with a priority level higher than it have been processed. Consequently, the mean memory access time of the overall system is prolonged, and the application efficiency of the memory is decreased. This is a disadvantage.

Also, for arbitration circuit 112, the design is made in consideration of the case of competition of any number among all of the request signals $ARQ_1$–$BRQ_N$ in any combination. Consequently, the number of circuit configurations corresponds to the number of memories, and it is difficult to achieve standardization.

Generally speaking, for the arbiter circuit shown in FIG. 9, while it is possible to handle a number of memories, as the number of memories is increased, the aforementioned disadvantage becomes more and more prominent. This is a disadvantage.

It is an object of the present invention to provide an arbiter circuit for a number of memories in which the memories can operate independently without mutual interference, and even when the number of memories is increased, the circuit configuration still does not become complicated, and the cost of the circuit still does not rise.

SUMMARY OF THE INVENTION

In accordance with the invention, an arbiter circuit is provided which comprises: receiving means for receiving a number of request signals for each of a number of memories; arbitration means which performs arbitration between the number of request signals received by the receiving means for each of the number of memories; and memory cycle generating means which generates simultaneously for the number of memories the memory cycles for operation of the number of memories corresponding to any request selected by the arbitration means.

In the arbiter circuit in accordance with the invention, each of the number of memories is allotted a receiving means and an arbitration means. In each arbitration means, one request can be selected at a time. The requests selected by the various arbitration means are sent to the various memories at the same time in the common memory cycle generated by the memory cycle generating means. By using this method, even when competition takes place between the number of request signals with respect to each memory, there is no competition between the number of request signals with respect to the different memories. Consequently, there is no priority among the number of memories, and each memory is able to operate independently from the other memories. Also, during the process of the write operation corresponding to the write signal in a certain memory, it is also possible to perform the read operation corresponding to the read request signal in the other memory, while the various memory cycles are synchronous with each other, and there is thus no noise interference.

In reference numerals as shown in the drawings:
10(1)–10(N), 10($i$), receiving circuit
12(1)–12(N), 12($i$), arbitration circuit
14(1)–14(N), 14($i$), arbiter unit
16, memory cycle generator
30(1), 30(2), multiport type field memory
50, arbiter circuit
52(1), 52(2), arbiter unit
54, memory cycle generator
56, receiving circuit
58, arbitration circuit

DESCRIPTION OF THE PREFERRED EMBODIMENTS

Figure 1:
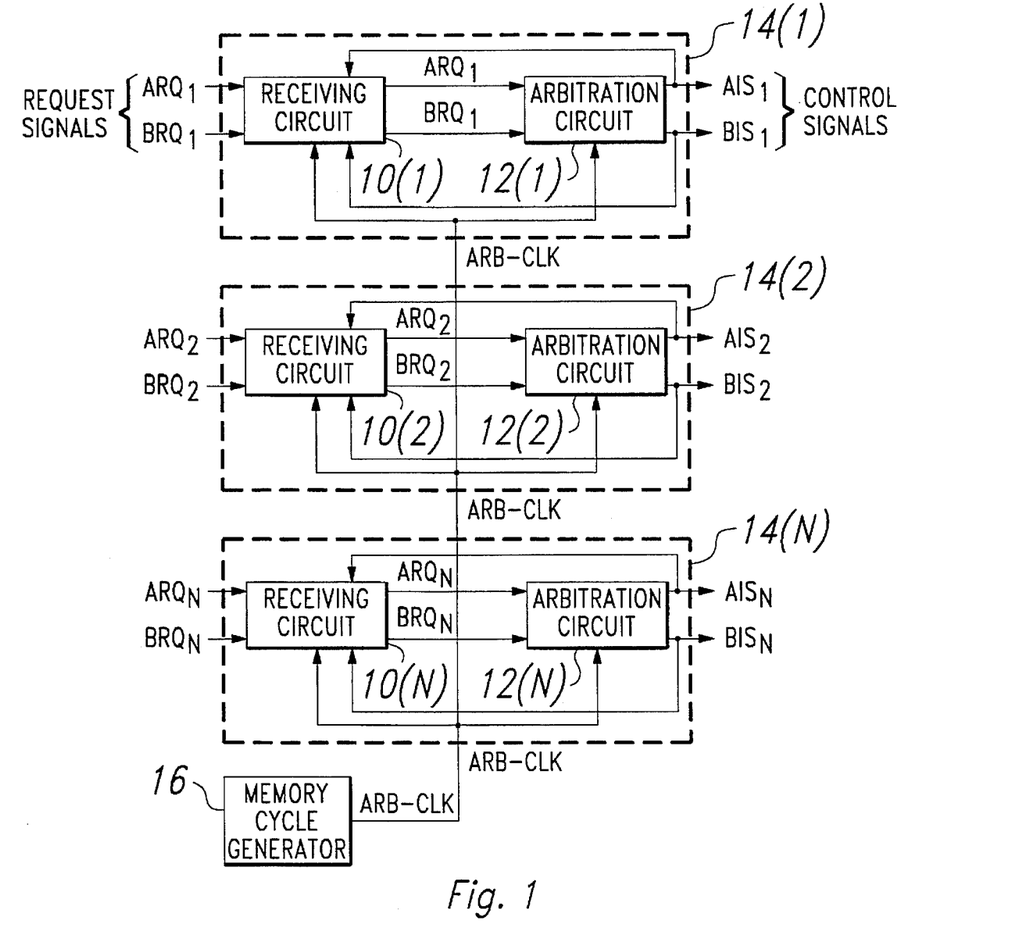
FIG. 1 is a block diagram of an arbiter circuit in accordance with the invention.

FIG. 1 illustrates the basic configuration of an arbiter circuit in accordance with the invention.

The arbiter circuit of the invention basically comprises a number of (N) (for example, two) receiving circuits 10(1), 10(2), . . . , 10(N) for receiving a number of (for example, two for each memory) request signals (ARQ$_1$, BRQ$_2$), (ARQ$_2$, BRQ$_2$), . . . , (ARQ$_N$, BRQ$_N$) for each of a number of (N) memories (not shown in the figure); a number of (N) arbitration circuits 12(1), 12(2), . . . , 12(N) for performing arbitration between a number of request signals ARQ$_i$ and BRQ$_i$ ($i$=1, 2, . . . , N) received by receiving circuits 10($i$) for each of the number of memories; and common memory cycle generator 16 which simultaneously generates memory cycles for the number of memories for the operation of each of the number of memories corresponding to the request selected by arbitration circuit 12($i$).

For each memory, a number of request signals ARQ$_i$ and BRQ$_i$ are fed to various receiving circuits 10($i$) in an asynchronous manner. When these request signals ARQ$_i$ and BRQ$_i$ do not compete, that is, when ARQ$_i$ or BRQ$_i$ is sent to each receiving circuit 10($i$) each time, the request of the request signal ARQ$_1$ or BRQ$_i$ is selected by arbitration circuit 12($i$) in its original form (without arbitration). Whenever these request signals ARQ$_i$ and BRQ$_i$ compete with each other, that is, when they are sent at the same time to various receiving circuits 10($i$), each arbitration circuit 12($i$) selects the request of one request signal XRQ$_i$ according to the predetermined priority at each arbitration circuit 12($i$), and the request of the remaining request signals are held at the respective receiving circuits.

In this way, when one request is selected using arbitration circuit 12($i$), corresponding to memory cycle clock pulse AFB-CLK from memory cycle generator 16, command (control signal) XIS$_i$ (X=A or B) for executing the memory cycle corresponding to the request is output from arbitration circuit 12($i$) to the memories.

When a number of request signals ARQ$_i$ and BRQ$_i$ compete with respect to the memories, corresponding to a request signal with the higher priority XRQ$_i$ (X=A or B), as the memory cycle is ended, the request signal of the next priority YRQ$_i$ (Y=B or A) in the standby state in receiving circuit 10($i$) is selected by arbitration circuit 12($i$); as a response to next memory cycle clock pulse ARB-CLK, command (control signal) YIS$_i$ (Y=B or A) for executing the memory cycle corresponding to request signal YRQ$_i$ is output from arbitration circuit 12($i$).

In this way, in the arbiter circuit of the invention, standardized units (arbiter units) 14($i$) made of standardized receiving circuits 10($i$) and arbitration circuits 12($i$) connected in series are allotted to a number of memories; common memory cycle clock pulse ARB-CLK is sent from memory cycle generator 16 to all of the arbiter units 14(1)–14(N). The commands with respect to the memories are output from arbiter units 14(1)–14(N) based on memory cycle clock pulse ARB-CLK in synchronous timing with each other.

In this configuration, even when the number of request signals compete with respect to each memory, there is no competition between the number of request signals with respect to different memories. Consequently, there is no priority between the number of memories, and each memory can operate independently from the other memories. During the write operation corresponding to the write request signal for a certain memory, it is also possible to perform the read operation corresponding to the read request signal for the other memories. As the various memory cycles are synchronous with each other, there is no noise interference or other mutual influence. In addition, memory cycle generator 16 is shared by all of the memories, and arbiter units 14 with standardized circuit configurations are arranged with a number equal to the number of memories. Consequently, the arbiter circuit corresponding to any number of memories can be formed easily. As a result, the cost of the circuit can be reduced, the circuit design can be simplified, and it is possible to improve the reliability and reproducibility of the circuit operation.

In the following, the arbiter circuit of the invention shown in FIGS. 2–6 will be explained with respect to an embodiment in which the arbiter circuit is used in the field memory.

Figure 2:
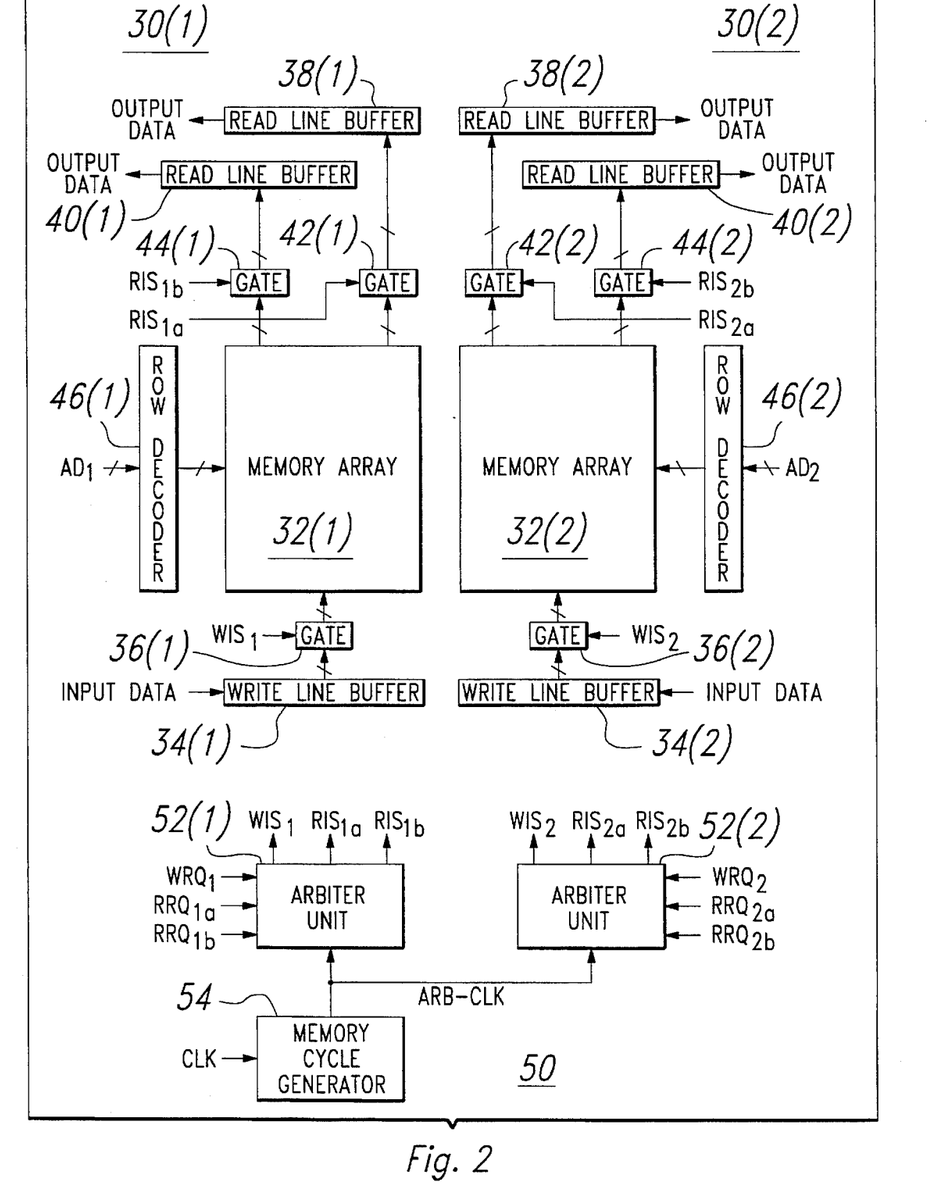
FIG. 2 is a block diagram of a memory system in which an arbiter circuit in accordance with the invention is applied in the field memory.

As shown in FIG. 2, the memory system has two multiport type field memories 30(1) and 30(2). In field memories 30(1) and 30(2), a number of memory elements are arranged in a matrix to form memory arrays 32(1) and 32(2), which are connected through gate circuits 36(1) and 36(2) to write line buffers 34(1) and 34(2), and which are connected to two read line buffers 38(1), 40(1), 38(2) and 40(2) through gates 42(1), 44(1), 42(2) and 44(2), respectively.

During the write or read function of various field memories 30(1) and 30(2), row address signals AD$_1$ and AD$_2$ are input to row decoders 46(1) and 46(2). Corresponding to the output signals of row decoders 46(1) and 46(2), the row is selected in the assigned memory arrays 32(1) and 32(2) of the address signals $AD_1$ and $AD_2$. One line of data is written from write line buffers 34(1) and 34(2) through gate circuits 36(1) and 36(2) to the selected row. Otherwise, a line of data is read to read buffers 38(1) and 38(2) or 40(1) and 40(2) through gate circuits 42(1) and 42(2) or 44(1) and 44(2), respectively.

In this way, for field memories 30(1) and 30(2), in the case of the write function, memory cycles are controlled by command (control signal) $WIS_1$ and $WIS_2$ fed to gate circuits 36(1) and 36(2); in the case of the read function, memory cycles are controlled by commands (control signals) $RIS_{1a}$ and $RIS_{2a}$ or $RIS_{1b}$ and $RIS_{2b}$ sent to gate circuits 42(1) and 42(2) or 44(1) and 44(2), respectively.

In this memory system, the arbiter circuit 50 is made of two arbiter units 52(1) and 52(2), and one memory cycle generator 54. Two arbiter units 52(1) and 52(2) are allotted to field memories 30(1) and 30(2).

Arbiter unit 52(1) receives, in an asynchronous manner, the following three request signals with respect to field memory 30(1): write request signal $WRQ_1$ for requesting the write operation of one line of data sent to memory array 32(1) through line buffer 34(1); first read request signal $RRQ_{1a}$ for requesting the read operation for one line of data from memory array 32(1) through read line buffer 38(1); and second read request signal $RRQ_{1b}$ for requesting the data read operation of one line of data from memory array 32(1) through read line buffer 40(1). Arbiter unit 52(1) conducts arbitration according to the prescribed priority when these request signals $WRQ_1$, $RRQ_{1a}$, and $RRQ_{1b}$ compete with each other, and the arbiter unit 52(1) also selectively outputs with the prescribed priority commands (control signals) $WIS_1$, $RIS_{1a}$, and $RIS_{2a}$ corresponding to the requests, in timing of memory cycle clock pulse ARB-CLK.

Arbiter unit 52(2) receives, in an asynchronous manner, the following three request signals with respect to field memory 30(2): write request signal $WRQ_2$ for requesting the write operation of one line of data sent to memory array 32(2) through line buffer 34(2); first read request signal $RRQ_{2a}$ for requesting the read operation for one line of data from memory array 32(2) through read line buffer 38(2); and second read request signal $RRQ_{2b}$ for requesting the data read operation of one line of data from memory array 32(2) through read line buffer 40(2). Arbiter unit 52(2) concludes arbitration according to the prescribed priority when these request signals $WRQ_2$, $RRQ_{2a}$, and $RRQ_{2b}$ compete with each other, and it also selectively outputs with the prescribed priority commands (control signals) $WIS_2$, $RIS_{2a}$, and $RIS_{2b}$ corresponding to the requests, in timing of memory cycle clock pulse ARB-CLK.

In this way, the commands to two field memories 30(1) and 30(2) are sent from dedicated arbiter units 52(1) and 52(2). Consequently, two field memories 30(1) and 30(2) are synchronous with each other, and thus there is no mutual influence, such as noise interference, etc., in the memory cycle, and the respective memory operations can be performed independently.

Figure 3:
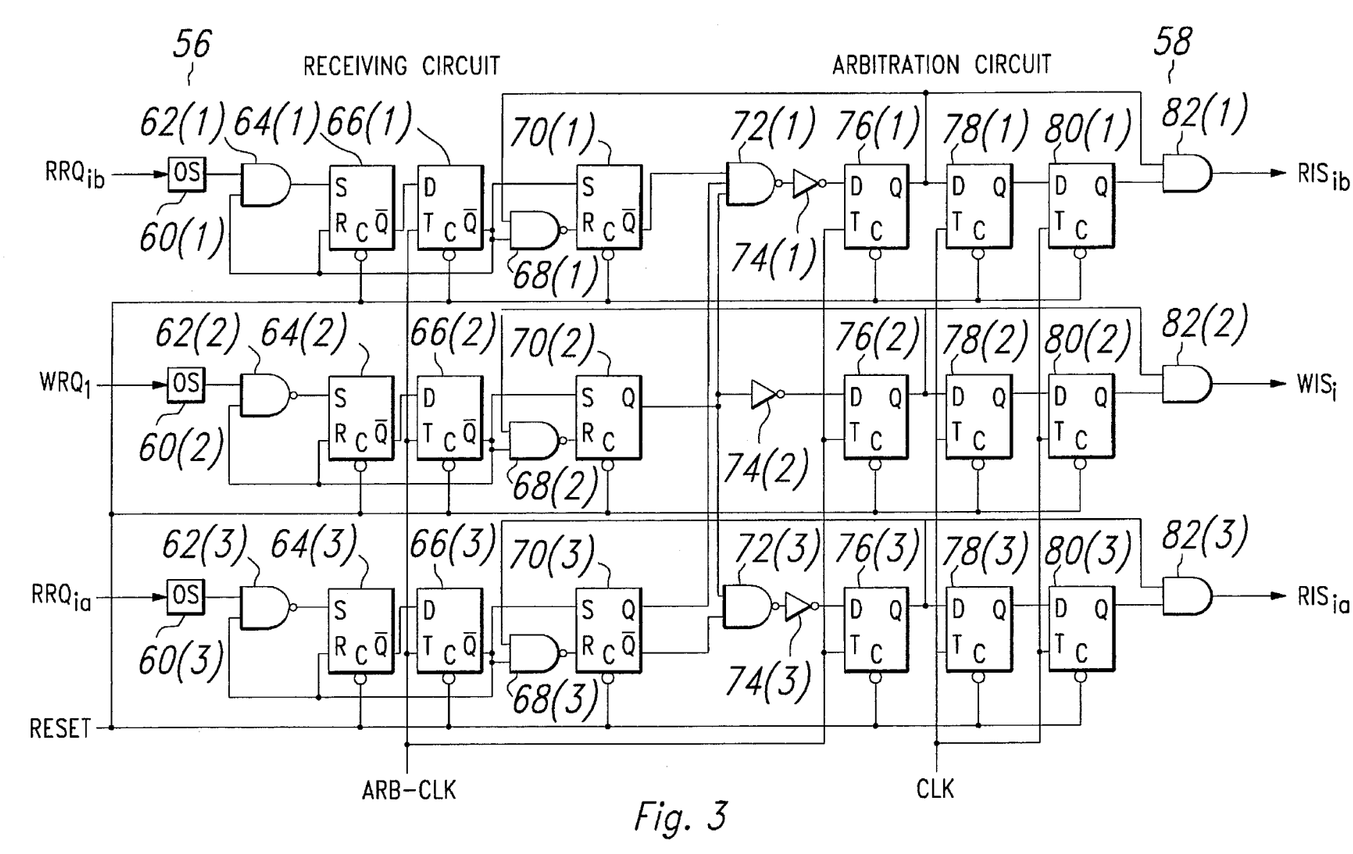
FIG. 3 is a circuit diagram of the specific circuit in each arbiter unit in the arbiter circuit shown in FIG. 2.

FIG. 3 is a diagram illustrating the specific circuit configuration of arbiter units 52(1) and 52(2). Just as in the basic circuit shown in FIG. 1, each of arbiter units 52(1) and 52(2) has its interior made of receiving circuit 56 and arbitration circuit 58, which are connected in series.

For each of the three request signals $RRQ_{ib}$, $WRQ_i$, and $RRQ_{ia}$, receiving circuit 56 has one-shot circuit $60(j)$, NAND circuit $62(j)$, RS-type flip-flop $64(j)$, D-type flip-flop $66(j)$, NAND circuit $68(j)$, and RS-type flip-flop $70(j)$ (j=1, 2, and 3).

When an H-level request signal with any duration is input to one-shot circuit $60(j)$, an H-level pulse with a prescribed pulse width is output from the output terminal of one-shot circuit $60(j)$. In this case, when the inverted output terminal Q_ of D-type flip-flop $66(j)$ becomes an H level, an L-level voltage is obtained at the output terminal of NAND circuit $62(j)$, and H-level voltage is obtained at inverted output terminal Q_ of RS-type flip-flop $64(j)$.

Right after that, memory cycle clock pulse ARB-CLK is sent to the clock terminal T of D-type flip-flop $66(j)$; then, H-level voltage from inverted output terminal Q_ of RS-type flip-flop $64(j)$ is sent to data input terminal D of D-type flip-flop $66(j)$, and inverted output terminal Q_ of D-type flip-flop $66(j)$ becomes an L level. The voltage state (L level) of inverted output terminal Q_ of D-type flip-flop $66(j)$ is latched to RS-type flip-flop $70(j)$.

In receiving circuit 56, when three request signals $RRQ_{ib}$, $WRQ_i$, and $RRQ_{ia}$ are input to one-shot circuits 60(1), 60(2), and 60(3) in the input section; immediately afterwards, in timing of memory cycle clock pulse ARB-CLK, L-level data is latched as request-annexed data to RS-type flip-flop circuits 70(1), 70(2), and 70(3) in the output stage.

Also, when inverted output terminal Q_ of D-type flip-flop $66(j)$ becomes an L level, right afterwards, the output of NAND circuit $62(j)$ returns to the H level, inverted output terminal Q_ of RS-type flip-flop $64(j)$ becomes L level, and, in timing of memory cycle clock pulse ARB-CLK, inverted output terminal Q_ of D-type flip-flop $66(j)$ is reset to the H level.

For RS-type flip-flop 70(1) with respect to the second read request signal $RRQ_{ib}$, when the request receiving data from D-type flip-flop 66(1) is latched, the L-level data is output from its inverted output terminal Q_ as the request held data. In this embodiment, as the priority of second read request signal $RRQ_{ib}$ is set at the lowest priority among the three request signals, the request held data from RS-type flip-flop 70(1) are only sent to the input terminal of 3-input type NAND circuit 72(1) in the input section corresponding to second read request signal $RRQ_{ib}$.

In RS-type flip-flop 70(2) with respect to write request signal $WRQ_i$, when request receiving data is fetched from D-type flip-flop 66(2), L-level data is output as the request holding data from its noninverted output terminal Q. AS the priority level of write request signal $WRQ_i$ is set as the highest priority level, the request holding data from RS-type flip-flop 70(2) is sent directly to the input terminal of NOT circuit 74(2) in the input section corresponding to write request signal $WRQ_i$ in arbitration circuit 58. At the same time, in order to mask the request holding data with a lower priority level, said data is also sent to the input terminal of 2-input type NAND circuit 72(3) in the input section corresponding to first read request signal $RRQ_{ia}$, and the input terminal of 3-input type NAND circuit 72(1) corresponding to second read request signal RRQ$ib$.

In RS-type flip-flop 70(3) with respect to first read request signal $RRQ_{ia}$, when request receiving data is fetched from D-type flip-flop 66(3), H-level data is output as the request holding data from its inversion output terminal Q_. The request holding data is sent to the input terminal of 2-input type NAND circuit 72(3) in the input section corresponding to first read request signal $RRQ_{ia}$. As the priority level of first read request signal $RRQ_{ia}$ is set lower than the priority level of write request signal $WRQ_i$ and higher than the priority level of second read request signal $RRQ_{ib}$, the L-level output from noninverted output terminal Q of RS-type flip-flop 70(3) is sent as a masking signal to the input terminal of 3-input type NAND circuit 72(1) in the input section with respect to second read request signal $RRQ_{ib}$ in arbitration circuit 58.

Arbitration circuit 58 has NOT circuit 74(j), D-type flip-flop circuits 76(j), 78(j), and 80(j) and AND circuit 82(j) with respect to the three request signals $RRQ_{ib}$, $WRQ_i$, and $PRQ_{ia}$, respectively. In addition, NAND circuits 72(3) and 72(1) are arranged for masking in the input section with respect to first and second read request signals $RRQ_{ia}$ and $RRQ_{ia}$ with a lower priority level, respectively.

At the input terminal of NAND circuit 72(1) in the input section, that is, the input terminal of NOT circuit 74(1), with respect to second read request signal $RRQ_{ib}$ with the lowest priority level, L-level voltage can be obtained only when the request holding data corresponding to second read request signal $RRQ_{ib}$ from RS-type flip-flop 70(1) of receiving circuit 56 alone are output, that is, only when second read request signal $RRQ_{ib}$ is received and held at receiving circuit 56 without competition with other request signals $WRQ_i$ and $RRQ_{ia}$. In this case, the output terminal of NOT circuit 74(1) becomes an H level. Immediately afterwards, when memory cycle clock pulse ARB-CLK from memory cycle generator 54 is input to clock input terminal T of D-type flip-flop 76(1), noninverted output terminal Q of D-type flip-flop 76(1) becomes an H level.

The H-level output from noninverted output terminal Q of D-type flip-flop 76(1) is input to one-side input terminal of AND circuit 82(1) in the output section, and, at the same time, it is also sent to data input terminal D of D-type flip-flop 78(1). Immediately afterwards, when reference clock pulse CLK is sent to clock input terminal of D-type flip-flop 78(1), noninverted output terminal Q of D-type flip-flop 78(1) becomes an H level. Then, as next reference clock pulse CLK is sent to clock input terminal T of D-type flip-flop 80(1), noninverted output terminal Q of D-type flip-flop 80(1) becomes an H level, and H-level command $RIS_{ib}$ is output from output terminal of AND circuit 82(1).

As explained above, when noninverted output terminal Q of D-type flip-flop 76(1) becomes an H level, the output of NAND circuit 68(1) becomes an L level with respect to second read request signal $RRQ_{ib}$ in receiving circuit 56, and inverted output terminal Q_ of RS-type flip-flop 70(1) becomes an L level. In this way, the output of NAND circuit 72(1) in the input section becomes an H level with respect to second read request signal $RRQ_{ib}$ in arbitration circuit 58, and the output of NOT circuit 74(1) becomes an L level. Immediately afterwards, with timing of memory cycle clock pulse ARB-CLK, noninverted output terminal Q of D-type flip-flop 76(1) becomes an L level, the output of AND circuit 82(1) returns to the L level, and the duration of command $RIS_{ib}$ ends.

In this way, immediately after the request of second read request signal $RRQ_{ib}$ is selected by arbitration circuit 58, memory cycle clock pulse ARB-CLK is sent to D-type flip-flop 76(1), and command $RIS_{ib}$ is output at a time two cycles of reference clock pulse CLK later. At the time when the next pulse of memory cycle clock pulse ARB-CLK is sent to D-type flip-flop 76(1), the output of command $RIS_{ib}$ is stopped. In this embodiment, the delay of two cycles of reference clock pulse CLK by means of two D-type flip-flops 78(j) and 80(j) is made to provide the precharge period of the memory elements in memory array 32(i). Consequently, if needed, the two D-type flip-flops 78(j) and 80(j) in the output section may be omitted.

For first read request signal $RRQ_{ia}$ and write request signal $WRQ_i$, in arbitration circuit 58, the same operation as above is performed at the corresponding circuit units (72(3)–82(3)) and (74(2)–82(2)), respectively. That is, when the request is selected in the input section of arbitration circuit 58, that is, when the output of NOT circuits 74(3) and 74(2) becomes an exclusive H level, based on memory cycle clock pulse ARB-CLK and in a prescribed timing, one of the commands $RIS_{ia}$ and $WIS_i$ is selected and output from AND circuits 82(3) and 82(2).

In some cases, when first read request signal $RRQ_{ia}$ is selected at arbitration circuit 58, AND circuit 72(3) is not masked by the L-level output from noninverted output terminal Q of RS-type flip-flop 70(2) of receiving circuit 56, that is, the request of write request signal $WRQ_i$ with a higher priority than that of first read request signal $RRQ_{ia}$ is not received and held in receiving circuit 56.

In the case of write request signal $WRQ_i$ with the highest priority level, at the time when it is received and held in receiving circuit 56, that is, at the time when an L-level request holding data are output from noninverted output terminal Q of the corresponding RS-type flip-flop 70(2), the request of write request signal $WRQ_i$ is selected irrespective of whether other request signals $RRQ_{ia}$ and $RRQ_{ib}$ are received and held at receiving circuit 56.

Figure 4:
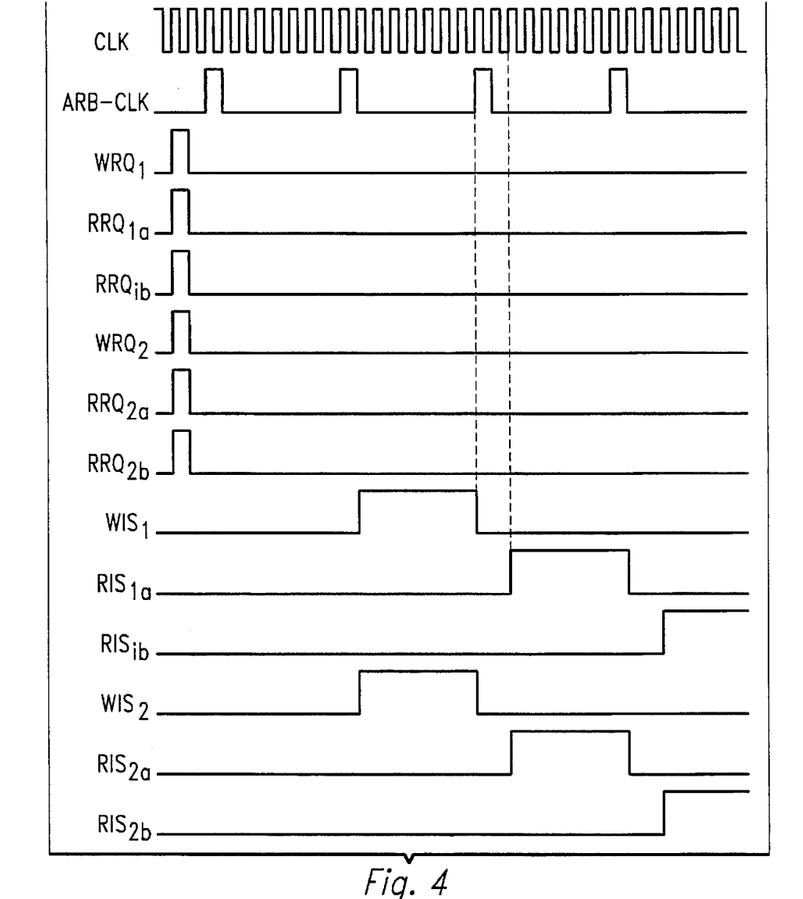
FIG. 4 is a timing diagram illustrating the timing of the output of the commands corresponding to all of the request signals input at the same time to two arbiter units in the arbiter circuit shown in FIG. 2.

FIG. 4 is a diagram illustrating the timing of the output of commands ($WIS_1$, $RIS_{1a}$, $RIS_{1b}$), ($WIS_2$, $RIS_{2a}$, $RIS_{2b}$) when the corresponding three request signals ($WRQ_1$, $RRQ_{1a}$, $RRQ_{1b}$) and ($WRQ_2$, $RRQ_2$, $RRQ_{2b}$) are all input at the same time in two arbiter units 52(1) and 52(2).

As shown in FIG. 4, in the timing of the memory cycle clock pulse ARB-CLK immediately after input of the request signal (the first memory cycle clock signal), the L-level request receiving data is latched in RS-type flip-flop 70(j) through D-type flip-flop 66(j) in receiving circuit 56 of each arbiter unit 52(i). In the timing of the second memory cycle clock pulse ARB-CLK, corresponding to the request of write request signal $WRQ_i$ with the highest priority level as selected by arbitration circuit 58 in each arbiter unit 52(i), command $WIS_i$ is generated. In the timing of the third memory cycle clock pulse ARB-CLK, corresponding to the request of first read request signal $RRQ_{ia}$ with the second highest priority level as selected by arbitration circuit 58 in each arbiter unit 52(i), command $RIS_{ia}$ is generated. In the timing of the fourth memory cycle clock pulse ARB-CLK, corresponding to the request of second read request signal $RRQ_{ib}$ with the lowest priority level as selected by arbitration circuit 58 in each arbiter unit 52(i), command $RIS_{ib}$ is generated.

In this embodiment, on both the side of arbiter unit 52(1) through field memory 30(1) and the side of arbiter unit 52(2) through field memory 30(2), the priority level of write request signal $WRQ_1$ and $WRQ_2$ is taken as the highest; the priority level of first read request signal $RRQ_{1a}$ and $RRQ_{2a}$ is taken as the second highest; and the priority level of second read request signal $RRQ_{1b}$ and $RRQ_{2b}$ is taken as the lowest. However, it is not necessary to have this priority established on both sides. It is possible to set an arbitrary priority among the number of request signals on each side of various arbiter units 52(i) through field memories 30(i). Also, the type of request signal may also contain the refresh request, etc., in addition to the write request signal and read request signal.

Figure 5:
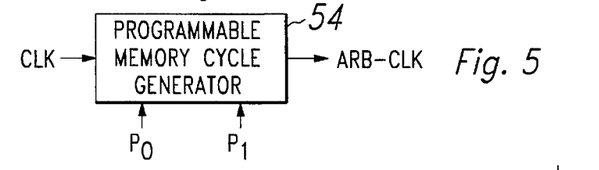
FIG. 5 is a block diagram of the memory cycle generator in programmable form in the arbiter circuit shown in FIG. 2.
Figure 6:
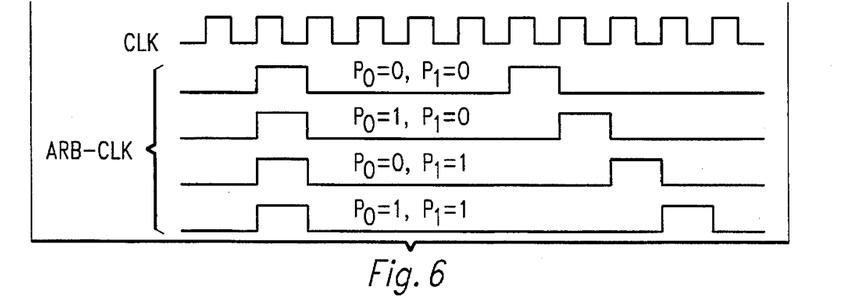
FIG. 6 is a timing diagram illustrating the function of the memory cycle generator shown in FIG. 5.

FIG. 5 is a block diagram of memory cycle generator 54 in the programmable form. FIG. 6 illustrates the pattern of change in the period of the output signal (memory cycle clock pulse ARB-CLK) of the programmable memory cycle clock generator 54 against various combinations of preset values $P_1$ and $P_2$ of 2 bits. However, the scheme shown in FIGS. 5 and 6 is not inclusive, and the period of memory cycle clock pulse ARB-CLK can be selected arbitrarily corresponding to the specifications of the memory system.

In an arbiter circuit in accordance with the invention, receiving means and arbitration means are allotted to a number of memories, respectively, and a common memory cycle generating means is used to generate memory cycles of a number of memories at the same time. Consequently, mutual interference between the memories can be prevented, and each memory can operate independently, so that the overall memory access time can be reduced and the memory application efficiency can be increased.

Also, in accordance with the invention, not only is the memory cycle generating means shared by all of the memories, but also the circuit configurations of the receiving means and the arbitration means can be standardized. Consequently, an arbiter circuit corresponding to any number of memories can be readily formed, the cost of the circuit can be reduced, and the circuit design process can be simplified. Also, it is possible to improve the reliability and reproducibility of the operation of the circuit.

We claim:

1. A common arbiter circuit for a plurality of memories, for arbitrating for each memory among a corresponding plurality of competing request signals received by the common arbiter circuit for that memory, comprising:

(a) a common memory cycle generator for generating a common clock pulse signal; and (b) for each memory, a corresponding separate arbiter unit for (i) receiving the common clock pulse signal and the corresponding plurality of competing request signals for that memory, (ii) determining which of the competing request signals has priority, and (iii) generating a corresponding timing command for the corresponding memory, at times designated by the common clock pulse signal;

whereby the common arbiter circuit enables the memories to operate simultaneously but independently.

2. The common arbiter circuit of claim 1 wherein the common arbiter circuit is adapted to arbitrate among a plurality of memories fabricated on a common semiconductor chip.

3. The command arbiter circuit of claim 1 wherein both the common arbiter circuit and the plurality of memories are fabricated on a common semiconductor chip.

4. A common arbiter circuit for a plurality of memories, for arbitrating for each memory among a corresponding plurality of competing request signals received by the common arbiter circuit for that memory, comprising:

(a) a common memory cycle generator for generating a common clock pulse signal; and (b) for each memory a corresponding separate arbiter unit having:

a receiving circuit coupled to receive (i) the common clock pulse signal, (ii) the corresponding plurality of competing request signals for that memory, and (iii) a feedback signal for that memory, and an arbitration circuit, coupled to receive (i) the common clock pulse signal from the common memory cycle generator and (ii) the plurality of competing request signals from the receiving circuit, for determining which of the competing request signals has priority and generating a corresponding timing command for transmission to the corresponding memory and receiving circuit, at times designated by the common clock pulse signal;

whereby the common arbiter circuit enables the memories to operate simultaneously but independently.

5. A method of simultaneously arbitrating, for a plurality of memories, among a plurality of competing request signals received for each memory, comprising the steps of:

(a) generating a common clock pulse signal;

(b) for each memory, at times designated simultaneously for all the memories by the common clock pulse:

(i) independently determining which of the competing request signals for that memory has priority, and (ii) generating a corresponding separate timing command for the corresponding memory.

6. The method of claim 5 wherein the memories are on a common semiconductor chip.

7. The method of claim 6 further including a preliminary step of providing a circuit on the command semiconductor chip for carrying out the remaining steps.

* * * * *